(12) United States Patent
Ideno

(10) Patent No.: US 11,316,514 B2
(45) Date of Patent: Apr. 26, 2022

(54) VOLTAGE DETECTION CIRCUIT AND POWER-ON RESET CIRCUIT

(71) Applicant: Kioxia Corporation, Tokyo (JP)

(72) Inventor: Hiroyuki Ideno, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/019,865

(22) Filed: Sep. 14, 2020

(65) Prior Publication Data

US 2021/0265991 A1 Aug. 26, 2021

(30) Foreign Application Priority Data

Feb. 26, 2020 (JP) .............................. JP2020-030941

(51) Int. Cl.
*H03K 17/14* (2006.01)
*H03K 17/22* (2006.01)
*H01L 27/06* (2006.01)

(52) U.S. Cl.
CPC ....... *H03K 17/223* (2013.01); *H01L 27/0629* (2013.01); *H03K 17/14* (2013.01)

(58) Field of Classification Search
CPC ... H03K 17/223; H03K 17/14; H01L 27/0629
See application file for complete search history.

(56) References Cited

U.S. PATENT DOCUMENTS

| 6,914,462 | B2 * | 7/2005 | Kim ..................... H03K 17/223 |
| | | | 327/143 |
| 7,834,680 | B2 | 11/2010 | Kim |
| 9,209,797 | B2 * | 12/2015 | Kadowaki ............ H03K 17/223 |
| 9,466,337 | B1 * | 10/2016 | Pan ..................... G01R 19/0084 |
| 10,228,713 | B1 * | 3/2019 | Hanschke ............... G05F 3/265 |
| 2004/0080395 | A1 | 4/2004 | Lin et al. |
| 2016/0164284 | A1 | 6/2016 | Kayama |

FOREIGN PATENT DOCUMENTS

JP     2013-228890 A     11/2013

* cited by examiner

*Primary Examiner* — Dinh T Le
(74) *Attorney, Agent, or Firm* — Oblon, McClelland, Maier & Neustadt, L.L.P.

(57) ABSTRACT

A voltage detection circuit includes a first transistor and a first resistor connected in series between a power supply voltage node and a reference voltage node, a second transistor and a second resistor connected in series between the power supply voltage node and the reference voltage node, a third transistor and a third resistor connected in series between the power supply voltage node and the reference voltage node, and a signal generator that outputs a signal corresponding to a voltage of a connection node between the third transistor and the third resistor. The second transistor is first turned on among the first to third transistors and a voltage level of the power supply voltage node increases, turning off the third transistor, and then a current flows through the first transistor and the first resistor. When the third transistor is turned on, the signal generator changes a logic of the signal.

19 Claims, 7 Drawing Sheets

VOLTAGE DETECTION CIRCUIT AND POWER-ON RESET CIRCUIT

CROSS REFERENCE TO RELATED APPLICATIONS

This application is based upon and claims the benefit of priority from the prior Japanese Patent Application No. 2020-30941, filed on Feb. 26, 2020, the entire contents of which are incorporated herein by reference.

FIELD

Embodiments of the present disclosure relate to a voltage detection circuit and a power-on reset circuit.

BACKGROUND

Advances in microfabrication technology have led to the development of memory chips and signal processing chips that operate at a voltage lower than 2 V.

DETAILED DESCRIPTION

According to one embodiment, a voltage detection circuit includes:

a first transistor and a first resistor connected in series between a power supply voltage node and a reference voltage node;

a second transistor and a second resistor connected in series between the power supply voltage node and the reference voltage node;

a third transistor and a third resistor connected in series between the power supply voltage node and the reference voltage node; and a signal generator that outputs a signal corresponding to a voltage of a connection node between the third transistor and the third resistor, wherein the second transistor is first turned on among the first to third transistors when power is on and a voltage level of the power supply voltage node increases, turning off the third transistor, and then a current flowing through the first transistor and the first resistor, to turn off the second transistor and turn on the third transistor, and the signal generator changes a logic of the signal when the third transistor is turned on.

Embodiments of a voltage detection circuit will now be described with reference to the accompanying drawings. The following descriptions mainly explain major constituent elements of voltage detection circuits. However, the voltage detection circuits may have other elements or functions that are not illustrated or explained. The following descriptions are not intended to exclude any element or function that is not illustrated or explained.

First Embodiment

Figure 1:
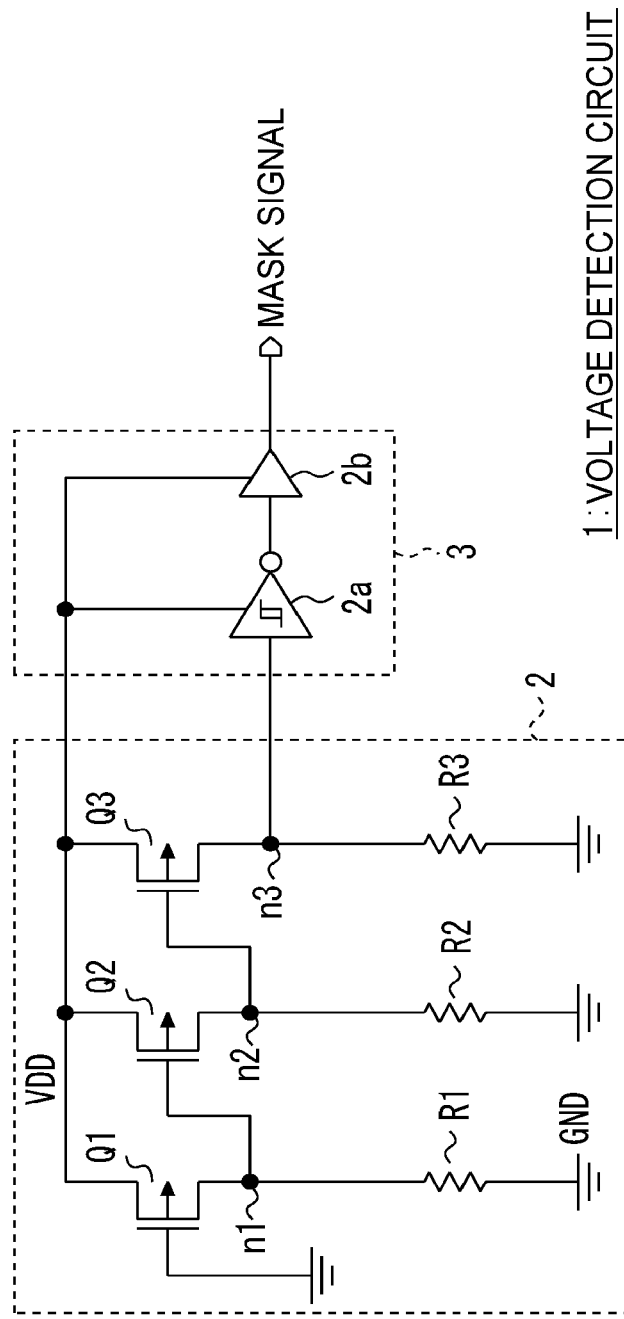
FIG. 1 is a circuit diagram illustrating a voltage detection circuit according to a first embodiment.

FIG. 1 is a circuit diagram of a voltage detection circuit 1 according to a first embodiment. The voltage detection circuit 1 shown in FIG. 1 generates a mask signal used in a power-on reset (POR) circuit that will be described later.

The voltage detection circuit 1 shown in FIG. 1 includes a voltage detector 2 and a signal generator 3. The voltage detector 2 includes first to third transistors Q1 to Q3 and first to third resistors R1 to R3.

The first transistor Q1 and the first resistor R1 are connected in series between a power supply voltage node VDD and a reference voltage node GND. The second transistor Q2 and the second resistor R2 are connected in series between the power supply voltage node VDD and the reference voltage node GND. The third transistor Q3 and the third resistor R3 are connected in series between the power supply voltage node VDD and the reference voltage node GND.

Specific voltage levels of the power supply voltage node VDD and the reference voltage node GND may be arbitrarily determined. In the following descriptions, the reference voltage node GND is a ground node (at which the voltage is 0 V, for example).

The third transistor Q3 is turned on or off according to the voltage of a connection node n2 between the second transistor Q2 and the second resistor R2. The second transistor Q2 is turned on or off according to the voltage of a connection node n1 between the first transistor Q1 and the first resistor R1.

When power is on, the voltage level of the power supply voltage node VDD gradually increases. As the voltage level of the power supply voltage node VDD increases, the second transistor Q2 is first turned on among the first to third transistors Q1 to Q3, turning off the third transistor Q3, and then a current flows through the first transistor Q1 and the first resistor R1, resulting in turning off the second transistor Q2 and turning on the third transistor Q3.

The signal generator 3 generates a mask signal. Specifically, when the third transistor Q3 is turned on, the signal generator 3 changes the logic of the mask signal. For example, the mask signal is at a high level immediately after the power is turned on, and changes to a low level when the voltage level of the power supply voltage VDD increases to a certain level. In the following descriptions, the high level corresponds to a mask state, and the low level corresponds to a mask reset state, for example. However, the high level may correspond to the mask reset state and the low level may correspond to the mask state. The signal generator 3 includes a logic inverter device, for example. The logic inverter device may include an inverter 2a of a Schmitt trigger type and a buffer 2b in order to avoid the influence of noise.

In the example of the voltage detection circuit 1 shown in FIG. 1, all of the first to third transistors Q1 to Q3 are p-type MOS transistors. However, the first to third transistors Q1 to Q3 may be n-type MOS transistors. If the first to third transistors Q1 to Q3 are n-type MOS transistor, the connection relationships among the transistors Q1 to Q3 and the resistors R1 to R3 connected between the power supply voltage node VDD and the ground node are opposite to those shown in FIG. 1, although no circuit diagram is provided in which the first to third transistors Q1 to Q3 are n-type MOS transistors. In the following descriptions, the first to third transistors Q1 to Q3 are p-type MOS transistors.

The first to third transistors Q1 to Q3 do not necessarily have the same size. For example, the second transistor Q2 may have the largest size, the third transistor Q3 may have an intermediate size, and the first transistor Q1 may have the smallest size. The "size" herein means the dimension of at least one of the gate width and the gate length of the transistor. As the gate width increases, for example, the size of transistor increases and a larger current flows through the transistor. Thus, the degree of the current flowing through each transistor may be changed by changing the size of the transistor.

The first to third resistors R1 to R3 do not necessarily have the same resistance value. For example, the first resistor R1 may have a larger resistance value that the second resistor R2 and the third resistor R3, and the second resistor R2 and the third resistor R3 may have the same resistance value.

The operation of the voltage detection circuit 1 shown in FIG. 1 will then be described. When the voltage level of the power supply voltage node VDD of the voltage detection circuit 1 shown in FIG. 1 gradually increases from the ground level, a voltage is first applied between the gate and the source of the second transistor Q2, which has the largest size. This causes a current to flow between the source and the drain of the second transistor Q2 to turn on the second transistor Q2. As the second transistor Q2 is turned on, the drain voltage of the second transistor Q2 (the voltage of the node n2) increases, turning off the third transistor Q3. Since the third transistor Q3 is turned off, the drain voltage of the third transistor Q3 (the voltage of the node n3) remains in the ground level, and the mask signal outputted from the signal generator 3 is kept at a high level and is not changed.

When the voltage level of the power supply voltage node VDD further increases, the voltage between the gate and the source of the first transistor Q1 goes beyond a threshold value, a current flows between the source and the drain of the first transistor Q1, and the drain voltage of the first transistor Q1 (the voltage of the node n1) increases. This increases the gate voltage of the second transistor Q2, and the state of the second transistor Q2 changes from the ON state to the OFF state. As the second transistor Q2 is turned off, the drain voltage of the second transistor Q2 (the voltage of the node n2) corresponding to the gate voltage of the third transistor Q3 decreases, and the third transistor Q3 is turned on. As the third transistor Q3 is turned on, the drain voltage of the third transistor Q3 (the voltage of the node n3) increases, and the state of the mask signal outputted from the signal generator 3 changes from the high level to the low level.

A current then flows between the source and the drain of the first transistor Q1. In order to reliably turn off the second transistor Q2 after this stage, another transistor may be provided, which forms a current mirror circuit with the first transistor Q1.

Figure 2:
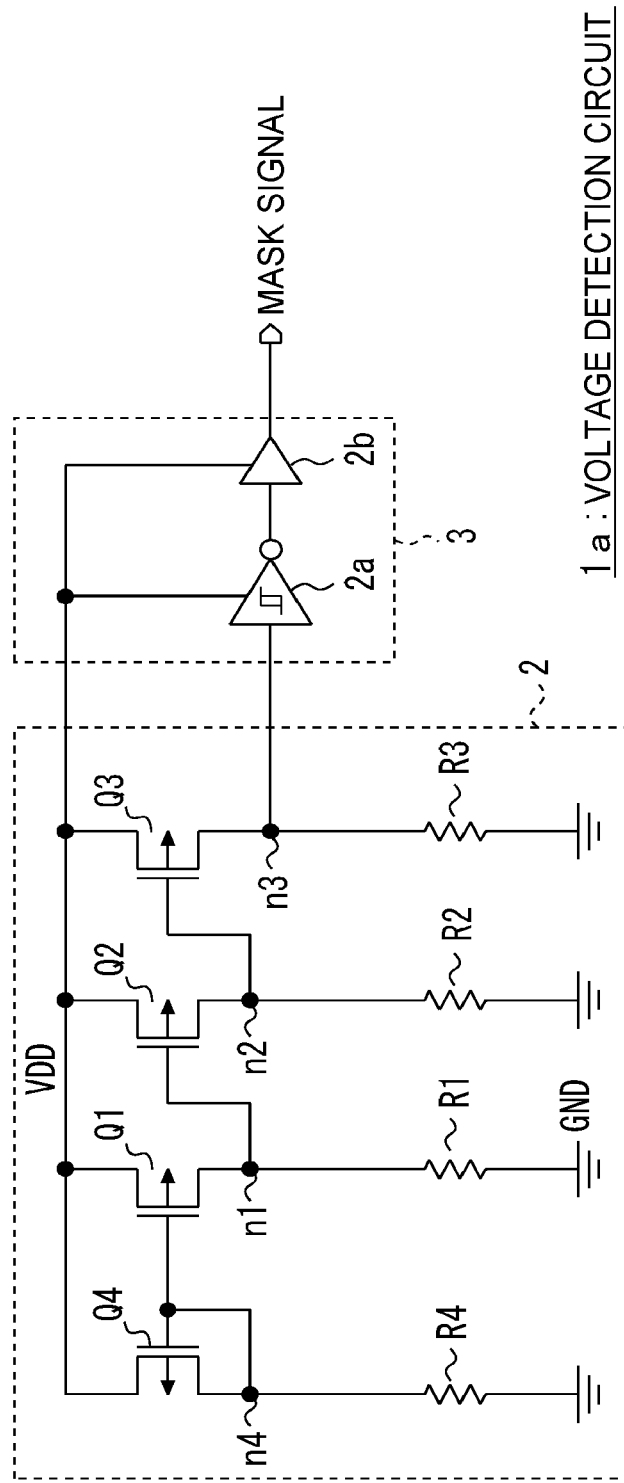
FIG. 2 is a circuit diagram illustrating a voltage detection circuit obtained by adding a fourth transistor and a fourth resistor to the circuit configuration shown in FIG. 1.

FIG. 2 is a circuit diagram illustrating a voltage detection circuit 1a obtained by adding a fourth transistor Q4 and a fourth resistor R4 to the circuit configuration shown in FIG. 1. The fourth transistor Q4 and the fourth resistor R4 included in the voltage detection circuit 1a shown in FIG. 2 are connected in series between the power supply voltage node VDD and the reference voltage node GND (for example, a ground node).

The fourth transistor Q4 may have the same size as the first transistor Q1, for example. The resistance value of the fourth resistor R4 may be smaller than that of the first resistor R1, or about the same as that of any of the first to third resistors R1 to R3.

Figure 3:
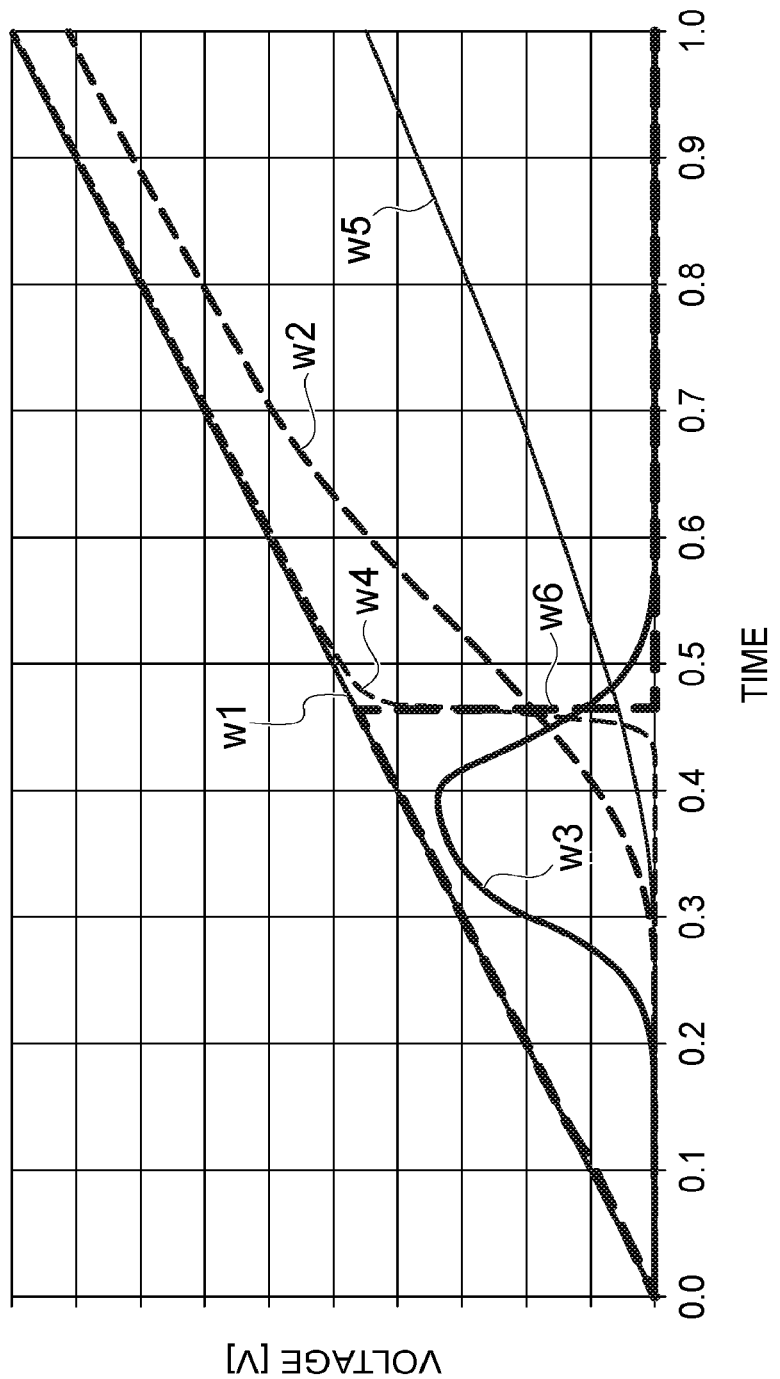
FIG. 3 is a voltage waveform diagram of a plurality of nodes in the voltage detection circuit shown in FIG. 2.
Figure 4:
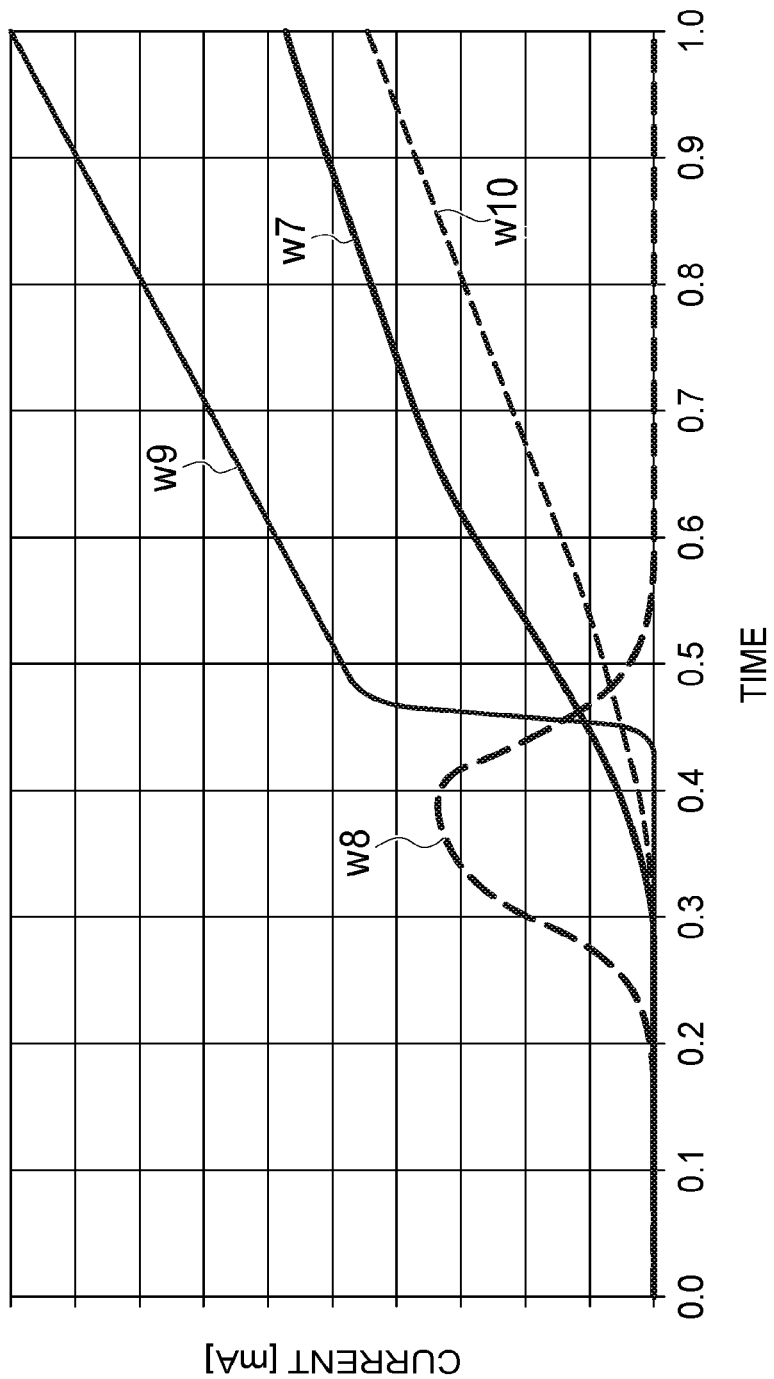
FIG. 4 is a current waveform diagram of the nodes of the voltage detection circuit shown in FIG. 2.

FIG. 3 is a voltage waveform diagram of a plurality of nodes in the voltage detection circuit 1a shown in FIG. 2, and FIG. 4 is a current waveform diagram of the nodes of the voltage detection circuit 1a shown in FIG. 2. The horizontal axis of FIG. 3 represents time, and the vertical axis represents voltage [V]. The horizontal axis of FIG. 4 represents time, and the vertical axis represents current [mA]. FIG. 3 shows a waveform w1 of the voltage at the power supply voltage node VDD, a waveform w2 of the drain voltage of the first transistor Q1, a waveform w3 of the drain voltage of the second transistor Q2, a waveform w4 of the drain voltage of the third transistor Q3, a waveform w5 of the drain voltage of the fourth transistor Q4, and a mask signal waveform w6 of the mask signal outputted from the signal generator 3. FIG. 4 shows a source-drain current waveform w7 of the first transistor Q1, a source-drain current waveform w8 of the second transistor Q2, a source-drain current waveform w9 of the third transistor Q3, and a source-drain current waveform w10 of the fourth transistor Q4.

The operation of the voltage detection circuit 1a shown in FIG. 2 will then be described with reference to FIGS. 3 and 4. As the voltage level of the power supply voltage node VDD gradually increases from the ground level (the waveform w1 in FIG. 3), a current flows between the source and the drain of the second transistor Q2, which has the largest size (waveform w8), and the second transistor Q2 is turned on. As a result, the drain voltage of the second transistor Q2 increases (waveform w3), turning off the third transistor Q3, and the drain voltage of the third transistor Q3 keeps the ground potential (waveform w4). Therefore, the mask signal outputted from the signal generator 3 has a voltage level that follows the power supply voltage VDD, and remains in a high level.

As the voltage level of the power supply voltage node VDD increases further, the source-drain current of the fourth transistor Q4 and that of the first transistor Q1 gradually increase (waveforms w7 and w10). As the drain voltage of the first transistor Q1 increases, the second transistor Q2 is turned off, and the drain voltage of the second transistor Q2 decreases (waveform W3). As a result, the third transistor Q3 is turned on, and the drain voltage of the third transistor Q3 rapidly increases (waveform w4). When the third transistor Q3 is turned on, the mask signal outputted from the signal generator 3 drops to the ground level (waveform w6).

As described above, in the first embodiment, while the voltage level of the power supply voltage node VDD is in a low range, the third transistor Q3 is forcibly kept in the OFF state. Therefore, the mask signal outputted from the signal generator 3 remains in the high level. When the voltage level of the power supply voltage node VDD increases to a relatively high level, the state of the third transistor Q3 changes from the OFF state to the ON state. As a result, the level of the mask signal outputted from the signal generator 3 changes to the low level, and the mask signal enters a mask reset state.

Recent microfabricated memory chips and signal processing chips are often driven with a low voltage, less than 2 V. In some cases, power supply voltages having different voltage levels may be used for circuit blocks in one chip.

The voltage level of such a chip is unstable immediate after the power supply voltage is applied to the chip. Therefore, a POR signal is supplied to forcibly reset each circuit block. Generally, the circuit blocks in the chip do not operate until the POR signal having a predetermined logic and the POR state is cancelled.

The POR signal is generated by a POR circuit, which generally includes a comparator for determining whether the power supply voltage reaches a predetermined threshold value, and a mask signal generator. The mask signal generator keeps generating the mask signal for preventing the change in logic of the POR signal until the power supply voltage level becomes stable so that the POR state is not immediately cancelled when the comparator malfunctions.

Since recent chips often operate at low power supply voltages, the operation of the mask signal generator often becomes unstable, which causes the power supply voltage level for cancelling the mask state to vary. Therefore, for example, although the mask signal is supposed to cancel the mask state after the comparator included in the POR circuit is ready to correctly output a comparison result, the mask state may be cancelled before the comparator is ready to correctly output the comparison result. In this case, the POR state may be cancelled even if the power supply voltage level is still low. This may cause a malfunction of the chip.

The main parts of the voltage detection circuits 1 and 1a shown in FIGS. 1 and 2 have simple circuit configurations including only p-type MOS transistors and resistors. Since the voltage level of the power supply voltage VDD for changing the logic of the mask signal is determined based only on the relative variations of the characteristics of the p-type MOS transistors and the resistances in this embodiment, the variations of the voltage level are considerably curbed as compared to conventional mask signal generators. Thus, the circuit configuration of the POR circuit using the signal outputted from the voltage detection circuit 1 or 1a according to this embodiment is simple and capable of preventing the mask signal for negating the POR signal from being dependent on the power supply voltage.

Second Embodiment

In a second embodiment, the voltage level of the power supply voltage VDD at which the mask signal cancels the mask state is adjustable.

Figure 5:
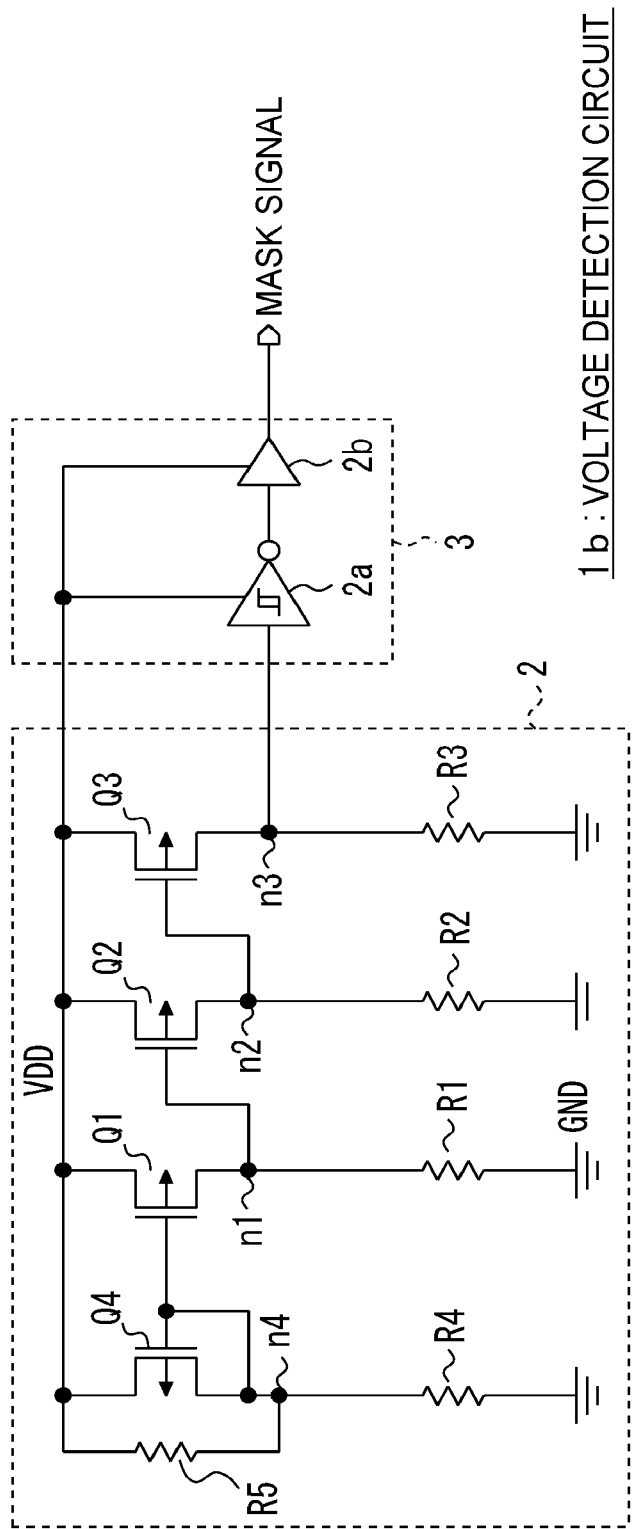
FIG. 5 is a circuit diagram illustrating a voltage detection circuit according to a second embodiment.

FIG. 5 is a circuit diagram of a voltage detection circuit 1b according to the second embodiment. In FIG. 5, the circuit elements common to those of FIG. 2 have the same reference numerals. In the following descriptions, differences between the circuit configurations shown in FIGS. 2 and 5 will mainly be described.

The voltage detection circuit 1b shown in FIG. 5 is obtained by adding a fifth resistor R5 connected in parallel between the source and the drain of the fourth transistor Q4 to the circuit configuration shown in FIG. 2.

With the fifth resistor R5, the gate voltage Vg of the first and fourth transistors Q1 and Q4 (the voltage of node n4) can be expressed as the following equation (1).

$$Vg = VDD \times R4/(R4+R5) \tag{1}$$

As can be understood from the equation (1), the existence of the fifth resistor R5 causes the gate voltage Vg of the first and fourth transistors Q1 and Q4 to be determined in accordance with the resistance ratio between the resistor R4 and the resistor R5. This means that the first and fourth transistors Q1 and Q4 are not turned on unless the power supply voltage VDD is higher than that of the voltage detection circuits 1 and 1a, and that therefore the second transistor Q2 is not turned off until the power supply voltage VDD reaches a higher value. Therefore, the voltage level of the power supply voltage VDD for changing the logic of the mask signal can be set higher.

The resistance value of the fifth resistor R5 may be fixed or variable. If the fifth resistor R5 is a variable resistor, the voltage level of the power supply voltage VDD for cancelling the mask state may be changed as needed.

Thus, in the second embodiment, in which the fifth resistor R5 is connected in parallel between the source and the drain line of the fourth transistor Q4, the voltage level of the power supply voltage VDD for cancelling the mask state may be adjusted in accordance with the resistance value of the fifth resistor R5.

Third Embodiment

A voltage detection circuit 1c according to a third embodiment generates a mask signal corresponding to two different power supply voltages.

Figure 6:
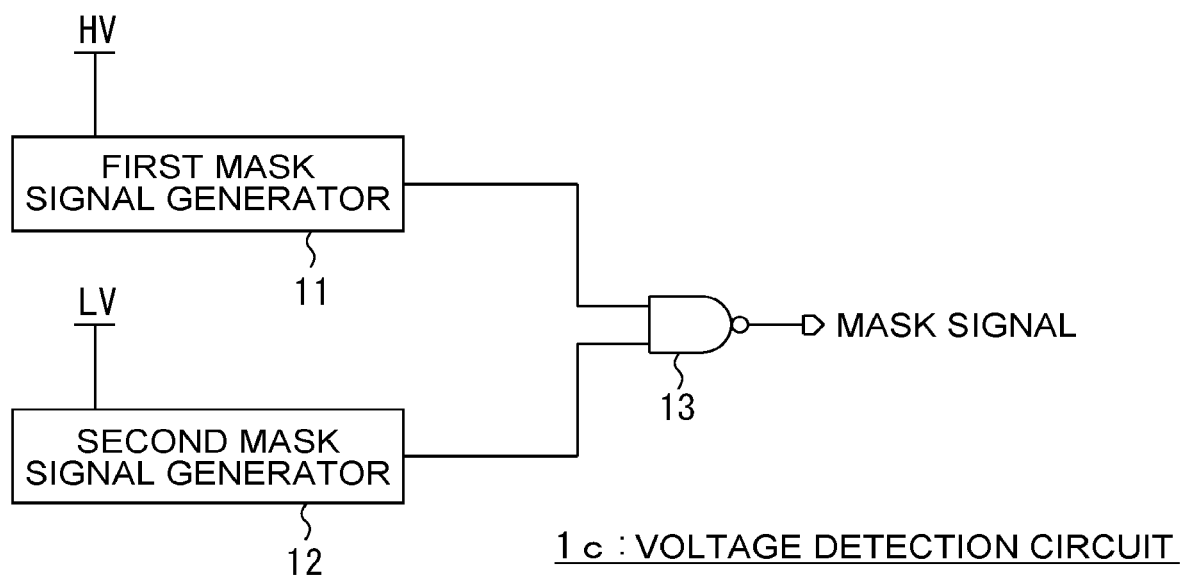
FIG. 6 is a circuit diagram illustrating a voltage detection circuit according to a third embodiment.

FIG. 6 is a circuit diagram of the voltage detection circuit is according to the third embodiment. The voltage detection circuit 1c shown in FIG. 6 includes a first mask signal generator 11, a second mask signal generator 12, and a signal synthesizer 13.

The first mask signal generator 11 generates a first mask signal for a first power supply voltage. The second mask signal generator 12 generates a second mask signal for a second power supply voltage that is lower than the first power supply voltage. The circuit configurations of the first mask signal generator 11 and the second mask signal generator 12 are the same as any of the circuit configurations of the voltage detection circuits 1, 1a, and 1b shown in FIGS. 1, 2, and 5 except for the power supply voltage level. In the following descriptions, the circuit configurations of the first mask signal generator 11 and the second mask signal generator 12 are the same as the circuit configuration of the voltage detection circuit 1a shown in FIG. 2.

More specifically, the power supply voltage supplied to the first mask signal generator 11 is a first power supply voltage HV instead of the power supply voltage VDD supplied to the voltage detection circuit 1a shown in FIG. 2. The power supply voltage supplied to the second mask signal generator 12 is a second power supply voltage LV instead of the power supply voltage VDD supplied to the voltage detection circuit 1a shown in FIG. 2. Specific voltage levels of the first power supply voltage HV and the second power supply voltage LV may be arbitrarily determined, but for example, the first power supply voltage HV may be about 2 V, and the second power supply voltage LV may be about 1.2V.

The first mask signal generator 11 operates in the same manner as the voltage detection circuit 1a shown in FIG. 2 until the first power supply voltage HV goes beyond a first threshold voltage. Specifically, the second transistor Q2 is first turned on, the third transistor Q3 is then turned off, and then the current flowing between the source and the drain increases in each of the first and fourth transistors Q1 and Q4. When the first power supply voltage HV goes beyond the first threshold voltage, the second transistor Q2 is turned off and the third transistor Q3 is turned on. This makes the state of the first mask signal from the low state (LOW) to the high state (HIGH).

Similarly, the second mask signal generator 12 operates in the same manner as the voltage detection circuit 1a shown in FIG. 2 until the second power supply voltage LV goes beyond a second threshold voltage. Specifically, the second transistor Q2 is first turned on, the third transistor Q3 is then turned off, and then the current flowing between the source and the drain increases in each of the first and fourth transistors Q1 and Q4. When the second power supply voltage LV goes beyond the second threshold voltage, the second transistor Q2 is turned off and the third transistor Q3 is turned on. This makes the state of the second mask signal from the low state (LOW) to the high state (HIGH).

The signal synthesizer 13 generates a mask signal that is LOW when the first mask signal is HIGH and the second mask signal is LOW. The signal synthesizer 13 may be a two-input NAND logic gate, for example.

Figure 7:
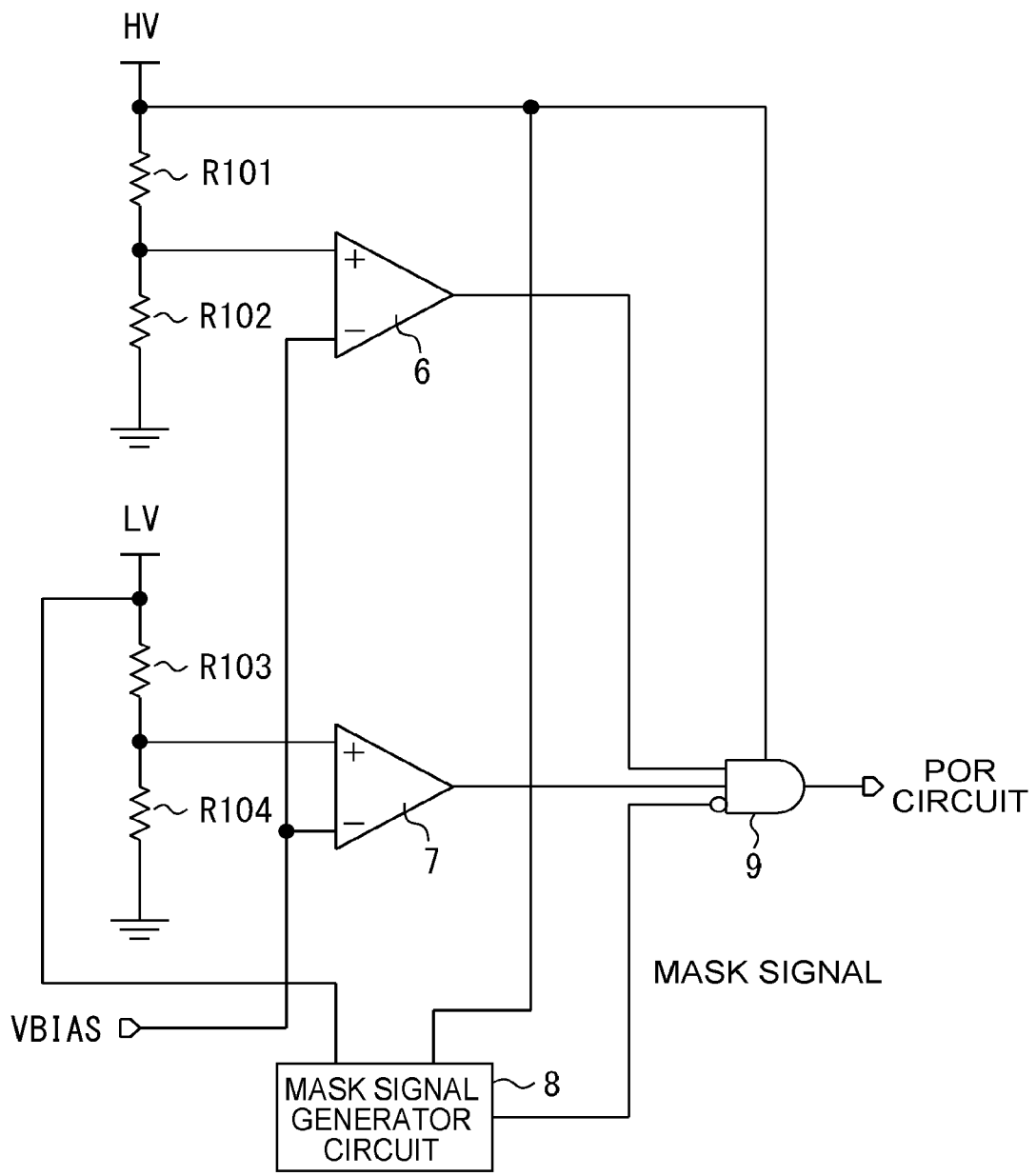
FIG. 7 is a circuit diagram illustrating an example of a POR circuit.

The voltage detection circuit 1c shown in FIG. 6 may be included in a POR circuit. FIG. 7 is a circuit diagram illustrating an example of a POR circuit 5. The POR circuit 5 shown in FIG. 7 includes a first comparator 6, a second comparator 7, a mask signal generator circuit 8, and a POR signal generator 9. The mask signal generator circuit 8 has the same configuration as the voltage detection circuit 1c shown in FIG. 6.

The first comparator 6 detects whether the first power supply voltage HV goes beyond the first threshold voltage. The first power supply voltage HV may not be directly compared with the first threshold voltage, but may first be converted to a lower voltage and then compared with a voltage corresponding to the first threshold voltage. For example, the first comparator 6 outputs a signal indicating whether a voltage obtained by dividing the first power supply voltage HV by means of resistors R101 and R102 is equal to or higher than a voltage VBIAS. The signal outputted from the first comparator 6 changes from LOW to HIGH when the voltage obtained by dividing the first power supply voltage HV by means of the resistors R101 and R102 becomes equal to or higher than the voltage VBIAS.

The second comparator 7 detects whether the second power supply voltage LV goes beyond the second threshold voltage. The second power supply voltage LV may not be directly compared with the second threshold voltage, but may first be converted to a lower voltage and then compared with a voltage corresponding to the second threshold voltage. For example, the second comparator 7 outputs a signal indicating whether the voltage obtained by dividing the second power supply voltage LV by means of resistors R103 and R104 is equal to or higher than the voltage VBIAS. The signal outputted from the second comparator 7 changes from LOW to HIGH when the voltage obtained by dividing the second power supply voltage LV by means of the resistors R103 and R104 becomes equal to or higher than the voltage VBIAS.

The POR signal generator 9 generates a POR signal that is HIGH when output signals of both the first comparator 6 and the second comparator 7 are HIGH and the mask signal outputted from the mask signal generator circuit 8 is LOW. The LOW state of the POR corresponds to the power-on reset state, and the HIGH state corresponds to the power-on reset cancellation state.

The signal outputted from the first comparator 6 is HIGH when the first power supply voltage HV is equal to or higher than the first threshold voltage. The signal outputted from the second comparator 7 is HIGH when the second power supply voltage LV is equal to or higher than the second threshold voltage. The mask signal is LOW when the mask state is cancelled. Therefore, the POR circuit 5 cancels the power-on reset state when the first power supply voltage HV is equal to or higher than the first threshold voltage, the second power supply voltage LV is equal to or higher than the second threshold voltage, and the mask state is cancelled.

Thus, in the third embodiment, if two types of power supply voltages are supplied, the first and second mask signals each generated by a circuit corresponding to any of the voltage detection circuit 1, 1a, or 1b shown in FIG. 1, FIG. 2, or FIG. 5 are synthesized to generate a mask signal that is ultimately outputted. When all of the power supply voltages reach predetermined voltage levels, the logic of the mask signal changes to cancel the mask state. The use of the mask signal generated according to the third embodiment in the POR circuit 5 may prevent the POR signal from erroneously outputted, thereby improving the reliability of the POR signal.

The invention claimed is:

1. A voltage detection circuit comprising:
   a first transistor and a first resistor connected in series between a power supply voltage node and a reference voltage node;
   a second transistor and a second resistor connected in series between the power supply voltage node and the reference voltage node;
   a third transistor and a third resistor connected in series between the power supply voltage node and the reference voltage node;
   a signal generator that outputs a signal corresponding to a voltage of a connection node between the third transistor and the third resistor;
   a fourth transistor and a fourth resistor connected in series between the power supply voltage node and the reference voltage node; and
   a fifth resistor connected in parallel between a drain and a source of the fourth transistor,
   wherein:
   the fourth transistor forms a current mirror circuit with the first transistor,
   a voltage level of the power supply voltage node to turn off the second transistor is adjusted in accordance with a resistance value of the fifth resistor,
   the second transistor is first turned on among the first to third transistors when power is on and a voltage level of the power supply voltage node increases, turning off the third transistor, and then a current flowing through the first transistor and the first resistor, to turn off the second transistor and turn on the third transistor, and
   the signal generator changes a logic of the signal when the third transistor is turned on.

2. The voltage detection circuit of claim 1, wherein:
   the third transistor is turned on or off according to a voltage of a connection node between the second transistor and the second resistor; and
   the second transistor is turned on or off according to a voltage of a connection node between the first transistor and the first resistor.

3. The voltage detection circuit of claim 1, wherein:
   a size of the second transistor is greater than a size of the first transistor and a size of the third transistor; and
   the size of the third transistor is greater than the size of the first transistor.

4. The voltage detection circuit of claim 1, wherein a resistance value of the first resistor is greater than a resistance value of the second resistor and a resistance value of the third resistor.

5. The voltage detection circuit of claim 1, wherein:
   a size of the fourth transistor is the same as the size of the first transistor; and
   a resistance value of the fourth resistor is smaller than the resistance value of the first resistor.

6. The voltage detection circuit of claim 1, wherein
the first to third transistors are p-type MOS transistors; and
the signal generator changes a logic of the signal when the voltage level of the power supply voltage node increases to a predetermined voltage level.

7. The voltage detection circuit of claim 1, wherein the fourth transistor is a p-type MOS transistor.

8. The voltage detection circuit of claim 1, wherein:
a gate of the second transistor is connected to a drain of the first transistor;
a gate of the third transistor is connected to a drain of the second transistor; and
the signal generator outputs the signal in accordance with a drain voltage of the third transistor.

9. The voltage detection circuit of claim 1, further comprising:
a first mask signal generator that generates a first mask signal for a first power supply voltage;
a second mask signal generator that generates a second mask signal for a second power supply voltage that is lower than the first power supply voltage; and
a signal synthesizer that outputs a mask signal obtained by synthesizing the first mask signal and the second mask signal, the signal synthesizer being applied with the first mask signal from the first mask signal generator and the second mask signal from the second mask signal generator,
wherein:
the first mask signal generator comprises a first voltage detector comprising fifth to eighth transistors and sixth to tenth resistors having a connection relationship that is the same as a connection relationship of the first to fourth transistors and the first to fifth resistors, the first power supply voltage being applied to a power supply voltage node of the first mask signal generator; and
the second mask signal generator comprises a second voltage detector comprising ninth to twelfth transistors and eleventh to fifteenth resistors having a connection relationship that is that same as a connection relationship of the first to fourth transistors and the first to fifth resistors, the second power supply voltage being applied to a power supply voltage node of the second mask signal generator.

10. The voltage detection circuit of claim 9, wherein the signal synthesizer changes a logic of the mask signal when both a logic of the first mask signal and a logic of the second mask signal change.

11. The voltage detection circuit of claim 1, wherein the fifth resistor is a variable resistor.

12. The voltage detection circuit of claim 1, wherein:
the gate of the fourth transistor, the source of the fourth transistor and the gate of the first transistor are connected to a common node; and
Vg=VDD×R4/(R4+R5) is established, where the Vg is a voltage at the common node, VDD is a voltage at the power supply voltage, R4 is a resistance of the fourth resistor, and R5 is a resistance of the fifth resistor.

13. A power-on reset circuit comprising:
a first comparator that detects whether a first power supply voltage goes beyond a first threshold voltage;
a second comparator that detects whether a second power supply voltage goes beyond a second threshold voltage;
a first mask signal generator comprising a first voltage detection circuit that generates a first mask signal for the first power supply voltage;
a second mask signal generator comprising a second voltage detection circuit that generates a second mask signal for the second power supply voltage, which is lower than the first power supply voltage; and
a signal synthesizer that outputs a mask signal obtained by synthesizing the first mask signal and the second mask signal; and
a power-on reset signal generator that outputs a power-on reset signal for cancelling a power-on reset state when the first comparator detects that the first power supply voltage goes beyond the first threshold voltage, the second comparator detects that the second power supply voltage goes beyond the second threshold voltage, and the signal synthesizer changes a logic of the mask signal,
the first voltage detection circuit comprising:
a first transistor and a first resistor connected in series between a first power supply voltage node to which the first power supply voltage is applied and a reference voltage node;
a second transistor and a second resistor connected in series between the first power supply voltage node and the reference voltage node;
a third transistor and a third resistor connected in series between the first power supply voltage node and the reference voltage node; and
a first signal generator that outputs a signal corresponding to a voltage of a connection node between the third transistor and the third resistor,
the second voltage detection circuit comprising:
a fourth transistor and a fourth resistor connected in series between a second power supply voltage node to which the second power supply voltage is supplied and a reference voltage node;
a fifth transistor and a fifth resistor connected in series between the second power supply voltage node and the reference voltage node;
a sixth transistor and a sixth resistor connected in series between the second power supply voltage node and the reference voltage node; and
a second signal generator that outputs a signal corresponding to a voltage of a connection node between the sixth transistor and the sixth resistor,
wherein the second transistor is first turned on among the first to third transistors when power is on and a voltage level of the first power supply voltage node increases, turning off the third transistor, and then a current flowing through the first transistor and the first resistor, to turn off the second transistor and turning on the third transistor,
the first signal generator changes a logic of the signal when the third transistor is turned on,
the fifth transistor is first turned on among the fourth to sixth transistors when power is on and a voltage level of the second power supply voltage node increases, turns off the sixth transistor, and then a current flows through the fourth transistor and the fourth resistor, to turn off the fifth transistor and turning on the sixth transistor, and
the second signal generator changes a logic of the signal when the sixth transistor is turned on.

14. The power-on reset circuit of claim 13, wherein:
the third transistor is turned on or off according to a voltage of a connection node between the second transistor and the second resistor;

the second transistor is turned on or off according to a voltage of a connection node between the first transistor and the first resistor;

the sixth transistor is turned on or off according to a voltage of a connection node between the fifth transistor and the fifth resistor; and the fifth transistor is turned on or off according to a voltage of a connection node between the fourth transistor and the fourth resistor.

15. The power-on reset circuit of claim 13, wherein:

a size of the second transistor is greater than a size of the first transistor and a size of the third transistor;

the size of the third transistor is greater than the size of the first transistor;

a size of the fifth transistor is greater than a size of the fourth transistor and a size of the sixth transistor; and the size of the sixth transistor is greater than the size of the fourth transistor.

16. The power-on reset circuit of claim 13, wherein:

a resistance value of the first resistor is greater than a resistance value of the second resistor and a resistance value of the third resistor; and a resistance value of the fourth resistor is greater than a resistance value of the fifth resistor and a resistance value of the sixth resistor.

17. The power-on reset circuit of claim 13, further comprising:

a seventh transistor and a seventh resistor connected in series between the first power supply voltage node and the reference voltage node; and an eighth transistor and an eighth resistor connected in series between the second power supply voltage node and the reference voltage node, wherein:

the seventh transistor forms a current mirror circuit with the first transistor;

a current flows through the first transistor and the first resistor in accordance with a current flowing through the seventh transistor and the seventh resistor;

the eighth transistor forms a current mirror circuit with the fourth transistor; and a current flows through the eighth transistor and the eighth resistor in accordance with a current flowing through the fourth transistor and the fourth resistor.

18. The power-on reset circuit of claim 17, wherein:

a size of the seventh transistor is the same as the size of the first transistor;

a resistance value of the seventh resistor is smaller than the resistance value of the first resistor;

a size of the eighth transistor is the same as the size of the fourth transistor; and a resistance value of the eighth resistor is smaller than the resistance value of the fourth resistor.

19. The power-on reset circuit of claim 17, further comprising:

a ninth resistor connected in parallel between a drain and a source of the seventh transistor; and a tenth resistor connected in parallel between a drain and a source of the eighth transistor.

* * * * *